United States Patent [19]

Kuus et al.

[11] 4,260,934
[45] Apr. 7, 1981

[54] ELECTRIC DEVICE PROVIDED WITH A SWITCH WHICH IS DESIGNED AS A DISCHARGE TUBE

[75] Inventors: Gijsbert Kuus; Robertus L. C. de Vaan; Cornelis A. J. Jacobs; Herman A. G. S. Smulders, all of Eindhoven, Netherlands

[73] Assignee: U.S. Philips Corporation, New York, N.Y.

[21] Appl. No.: 792,138

[22] Filed: Apr. 29, 1977

[30] Foreign Application Priority Data

May 5, 1976 [NL] Netherlands .................. 7604759

[51] Int. Cl.³ .................. H01J 11/04; F04B 37/02
[52] U.S. Cl. .................. 315/326; 313/174
[58] Field of Search .................. 313/174, 178, 179; 315/326, 358, 100, 106, 108, 183

[56] References Cited

U.S. PATENT DOCUMENTS 3,758,803  9/1973  Cook et al. .................. 313/178 X
3,953,755  4/1976  Kuus et al. .................. 313/178 X

FOREIGN PATENT DOCUMENTS 766064  1/1957  United Kingdom .................. 313/178

*Primary Examiner*—Alfred E. Smith
*Attorney, Agent, or Firm*—Robert S. Smith

[57] ABSTRACT

The invention relates to an electric device provided with a switch which is constructed as a discharge tube which comprises at least two main electrodes and a reversible hydrogen getter.

According to the invention the discharge tube contains a rare gas so that the current flow in the conducting state of the switch is mainly ensured by that rare gas. The non-conducting stage of the switch can be obtained by heating the getter. Namely, the hydrogen pressure in the discharge tube then becomes so high that the discharge in the tube is extinguished. Heating of the getter is preferably effected by the heat developed by the current between the main electrodes. This results in a self extinguishing breakdown element.

16 Claims, 7 Drawing Figures

ELECTRIC DEVICE PROVIDED WITH A SWITCH WHICH IS DESIGNED AS A DISCHARGE TUBE

The invention relates to an electric device provided with a switch which is designed as a discharge tube which comprises at least two internal main electrodes, a reversible hydrogen getter being present in the discharge tube, hydrogen being released from the getter when the temperature of the getter is increased and hydrogen being taken up by the getter when the temperature is decreased, the temperature of the getter being variable, and the amount of the hydrogen pressure in the discharge tube at least partly determines the electrical conductivity of the switch. The invention furthermore relates to a switch which is designed as a discharge tube and which is particularly suitable for an electric device as mentioned above.

An electric device of the type mentioned in the preamble is, for example, described in U.S. Pat. No. 3,331,988. A disadvantage of the switch in this known device is that the current cannot be switched off with that switch. A further disadvantage of the known device is that at high ambient temperatures the switch cannot be kept in the non-conducting state anymore.

It is an object of the invention to provide an electric device of the type mentioned in the preamble in which the current can be switched off by means of the switch and in which the switch can be kept in the non-conducting state also at a relatively high ambient temperature.

An electric device according to the invention provided with a switch which is designed as a discharge tube which comprises at least two internal main electrodes, a reversible hydrogen getter being present in the discharge tube, and in which hydrogen is released from the getter when the temperature of the getter is increased and hydrogen is taken up when the temperature is decreased, the temperature of the getter being variable, and the amount of the hydrogen pressure in the discharge tube at least partly determines the electrical conductivity of the switch, is characterized in that the discharge tube also contains a rare gas and that the switch can be switched over from the conducting state to the non-conducting state by such an increase of the getter-temperature that the magnitude of the required operating voltage of the discharge tube increases to above that of an electric voltage applied between the main electrode.

The required operating voltage of the discharge tube must herein be understood to mean the required electric voltage between the main electrodes of the discharge tube for maintaining a discharge between these main electrodes. In direct current situations this is, as a rule, the operating voltage of the discharge tube. In alternating current situations this also may be the required restarting voltage at the start of each half cycle of the power supply.

An advantage of an electric device according to the invention is that the switch can be brought to the non-conducting state by increasing the temperature of the getter. In this way the current through the switch can be interrupted. A further advantage of the electric device according to the invention is that at high ambient temperatures—owing to the relatively large hydrogen pressure in the discharge tube of the switch—the switch can be perfectly kept in the non-conducting state.

The invention is based on the notion that the rare gas in the discharge tube is mainly responsible for the transportation of current in the conducting state of the switch, and that then when the temperature of the reversible getter is increased so much hydrogen is brought into the discharge tube that the required operating voltage of the tube rises until the discharge is extinguished.

It is conceivable that the hydrogen getter of the switch is connected to a cooling element, the cooling element being uncoupled to make the switch non-conducting. Namely by the uncoupling of the cooling element the hydrogen getter assumes a higher temperature and consequently the hydrogen pressure in the discharge tube increases.

In a preferred embodiment of an electric device according to the invention the hydrogen getter is in intimate heat contact with the discharge path between the main electrodes.

An advantage of this preferred embodiment is that cooling elements are no longer necessary and that when the current strength through the switch exceeds a given intensity the hydrogen getter becomes so warm that the hydrogen pressure in the discharge tube rises to such a height that the switch switches the current off.

This has on the one hand the advantage of a protective function, namely a switching off of excessive currents. On the other hand this self-extinguishing property can be used if an intermittent operation of the switch is desired. For, as soon as the discharge has extinguished the temperature of the getter decreases. The hydrogen pressure becomes lower and the discharge tube starts again, etc.

In a further improvement of said last preferred embodiment the hydrogen getter is disposed on at least one of the main electrodes of the switch.

An advantage of this further improvement is that the hydrogen getter is now very close to the discharge path in the switch. Consequently this getter can react rapidly to undesired excessive currents through this switch. Owing to this high current the hydrogen pressure rises and the required operating voltage of the switch is increased.

In a following preferred embodiment of an electric device according to the invention the getter is provided with a separate electric heating element.

An advantage of this preferred embodiment may be that operating the switch is fully independent of the main current between the main electrodes. Namely, in that case it is possible to supply the electric heating element from a separate voltage source. However, it is also conceivable that this preferred embodiment is used in such a way that the heating element carries the same current as that which flows between the main electrodes of the discharge path, namely by connecting the discharge path and this heating element in series. This preferred embodiment will, for example, be used if a freer choice of the material of the main electrodes is desired.

It is also conceivable that only a part of the current through the main electrode is also passed through the heating element. This may, for example, be realized by shunting the heating element by an auxiliary branch.

In a further preferred embodiment of an electric device according to the invention the device is provided with an electric load which is electrically connected to the switch.

The electric load may, for example, be a device for giving acoustical warning signals, for example, a siren.

In a further improvement of said last preferred embodiment, the load is an electric lamp.

A special embodiment of said last device is obtained when the lamp is a discharge lamp and the device is intended for connection to an a.c. voltage mains in which the switch and the lamp are disposed in parallel branches and the switch is shunted by a circuit which comprises an electric coil and a capacitor, and the coil constitutes a primary winding of a transformer, a secondary winding of which is connected to a starter electrode of the lamp and the lamp is intended for connection to the mains supply through a stabilisation balast, the required starting voltage between the main electrodes of the switch in the operating condition of the lamp exceeding the lamp voltage.

An advantage of this last-mentioned device is that it offers a simple solution for starting and operating a discharge lamp. Namely, in that case the situation is obtained that first the capacitor is charged through a stabilisation ballast and that, after a given difference in voltage between the main electrodes of the switch is obtained a discharge occurs in that switch which generates heat therein which causes the hydrogen pressure in that switch to increase. This has been rated so that, as a consequence, the discharge between the main electrodes of the switch is interrupted. This results in a voltage peak in the primary winding of the transformer which is transformed to the secondary side of that transformer.

This produces a steep pulse at the starter electrode of the discharge lamp which pulse promotes an ignition of a discharge between the main electrodes of that lamp. If the lamp ignites the voltage between its main electrodes decreases to the operating voltage. This also results in that the voltage offered between the main electrodes of the switch also decreases. If it is ensured that the required ignition voltage or reignition voltage of this switch is above that offered voltage then the starter circuit is inoperative in the operating condition of the lamp.

A device according to the invention might, for example, also be used for starting other discharge devices, for example a plasma burner or a welding arc.

In a further preferred embodiment of the device according to the invention the switch is connected in series with the load so that the load is fed intermittently.

Also here the switch has a self-extinguishing character as namely the current through the switch itself results in an increase in the hydrogen pressure which causes the switch to extinguish. If, after some time, the switch has cooled again a current starts flowing through the switch, etc.

The load may, for example, be a lamp so that the electric device may, for example, be designed as flashing light. This may, for example, be a signalling light to warn of obstacles in a public road. It is also conceivable that this flashing light is designed as a blinker.

The switch may also be used in other circuits.

In a further preferred embodiment of a device according to the invention the load—to which the switch is coupled—is an apparatus for changing the temperature in an enclosed space, for example a room or an oven, in which the switch is responsive to the space temperature and forms part of a thermostatic device.

An advantage of that preferred embodiment is that when the temperature in the space decreases, the hydrogen pressure in the switch decreases and causes a current to start flowing through that switch, which current results in that further heating of the space. It is thereby often important—and also possible—that the switch can withstanding to high temperatures. This is not the case with, for example, controlled semiconductor switch elements which can only be used to approximately 100° C.

It is also conceivable that the switch is in parallel with an electric load.

In a further preferred embodiment of an electric device according to the invention the switch is connected in series with a semiconductor switching element which has the property that it does not become non-conducting until the strength of the current through it falls to below a hold current value of that element.

An advantage of this preferred embodiment is that in this manner—by increasing the hydrogen pressure in the switch—the circuit can be switched off in a simple manner. In general it is a problem to extinguish such a semiconductor element, for example, a thyristor. A switch according to the invention can be connected in series with the thyristor and with the gas discharge flash lamp and the flash lamp can be extinguished via that switch.

The invention also covers a switch which is particularly suitable for the electric devices according to the invention, in which this switch is designed as a discharge tube which comprises at least two internal main electrodes, a reversible hydrogen getter being present in the discharge tube and in which hydrogen is released when the temperature of the getter is increased and hydrogen is taken up when the temperature is decreased, and the amount of the hydrogen pressure in the discharge tube is co-determining for the electrical conductivity of the switch, a rare gas also being present in the discharge tube and in which it is a property of the getter that it has a temperature range of 200° C. within which the hydrogen pressure in the discharge tube changes by at least a factor of ten, the hydrogen pressure at the lower limit of this range being at least $10^{-3}$ Torr.

With this switch a relatively small temperature increase may exercise a large influence on the discharge in the switch and may extinguish this discharge.

In a switch according to the invention the hydrogen getter is, for example, titanium.

An advantage of this hydrogen getter is that the useful reversible getter process takes place in a temperature range between 300° C. and 500° C., so that after this discharge has extinguished a rapid cooling of the discharge tube by the ambient medium may be obtained. A further advantage is that a temperature of approximately 500° C. still permits the use of simple enveloping materials such as, for example, glass, and simple electric feed-throughs such as, for example, copper-clad wire.

For use of the switch above a temperature of 500° C. zirconium or a rare earth metal may, for example, be used as getter.

The main electrodes of the switch may, for example, be fixed to supports which are shielded from the discharge path by means of electrically insulating shields.

It is also conceivable that the main electrodes of the switch according to the invention are fixed to supports of which at least the outer layer consists of chromium oxide. An advantage thereof is that now no further insulating shields are necessary, namely because the use of chromium oxide already prevents the arc from acting on the supports of the main electrodes.

The rare gas in the discharge tube consists, for example, of neon.

In a preferred embodiment of a switch according to the invention, however, the rare gas in the discharge tube consists of neon with an addition of not more than 10% of argon.

An advantage of this preferred embodiment is that the ignition voltage of the switch is relatively low.

In a further preferred embodiment of a switch according to the invention the rare gas consists of argon and there is also mercury in the discharge tube.

An advantage of last-mentioned preferred embodiment is that the switch may carry a relatively large current.

In a further preferred embodiment of a switch according to the invention the discharge tube also comprises a starter electrode.

An advantage of this embodiment is that the discharge tube can be made conductive at a well-defined instant, namely by applying a suitable control signal to that starter electrode.

Embodiments of the invention will now be described with reference to the accompanying drawings in which.

Figure 1:
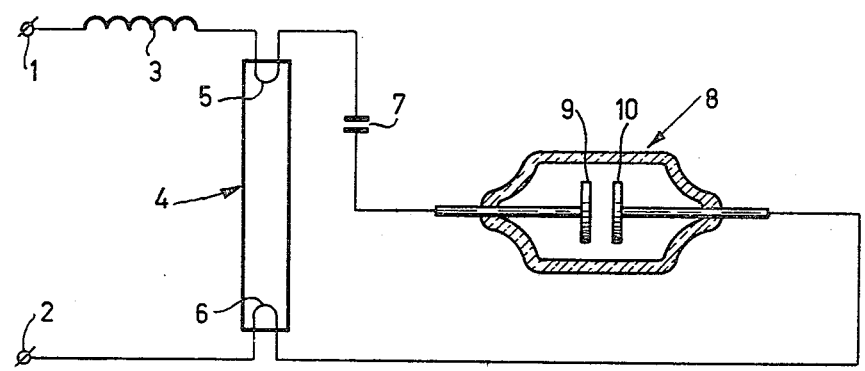
FIG. 1 shows a first electric device according to the invention in which a low-pressure mercury vapour discharge lamp represents an electric load.

In FIG. 1 references 1 and 2 are terminals which are intended for connection to a supply mains of approximately 220 Volt, 50 Hertz. Terminal 1 is connected through a stabilisation inductance 3 to an electrode 5 of a low-pressure mercury vapour discharge lamp 4. The electrode 5 is a preheatable electrode. Also the other side of the lamp 4 is provided with such a preheatable electrode 6. The electrode 6 is connected to the input terminal 2. The sides of the electrodes 5 and 6 which face away from terminals 1 and 2 are connected by means of a series arrangement of a capacitor 7 and a discharge tube 8 which is constructed as a switch. The tube 8 is provided with two main electrodes 9 and 10.

The tube 8 has a hard glass envelope of a mainly circular cylindrical shape. The length thereof is approximately 20 mm and the diameter approximately 16 mm. The main electrodes 9 and 10 consist of titanium hydride with an addition of approximately 5% by weight of molybdenum so that they act as hydrogen getters as hereinbefore described. The molybdenum addition ensures that the electrodes remain porous so that a rapid hydrogen absorption reaction or hydrogen desorption reaction respectively can take place. The main electrodes are disc-shaped. They have a diameter of approximately 10 mm and are approximately 2 mm thick.

The feed-throughs for conducting current to the main electrodes mainly consist of tungsten. The electrode spacing is 1.5 mm.

In the switch there is hydrogen and a mixture of rare gases consisting of neon with 0.5% of argon, at a pressure of approximately 350 Torr.

At room temperature (25° C.) the hydrogen pressure in the tube is below $10^{-5}$ Torr, at 300° C., the hydrogen pressure is approximately $10^{-1}$ Torr and at 500° C. it is 10 Torr. This shows that in the temperature range of 300° C. to 500° C. the hydrogen pressure changes by two decades and that the hydrogen pressure at the lower limit (300° C.) of this range is at least $10^{-3}$ Torr.

At room temperature the required ignition voltage of the tube or switch in the case of an a.c. voltage supply is approximately 250 Volts peak and the reignition voltage is also approximately 250 Volts peak. Approximately the same voltages are found up to 300° C. At 500° C. those ignition and reignition voltages are above 800 Volts.

The arrangement described operates as follows: If the terminals 1 and 2 are connected to the specified supply voltage a current first flows in the circuit 1, 3, 5, 7, 8, 6, 2; or, depending on the instantaneous polarity of the mains supply, in the reversed sequence. This current which is present in the discharge tube 8 in the form of a discharge between the electrodes 9 and 10 results in a certain heat generation in this discharge tube which causes hydrogen to be released from the titanium hydride electrodes. As a consequence, after some time, the hydrogen pressure in the tube 8 rises to such a level that the discharge between the electrodes 9 and 10 can no longer be maintained. This—as a rule rather abrupt—current interruption produces a voltage peak between the electrodes 5 and 6 of the lamp owing to the presence of the inductor 3. As the electrodes 5 and 6 are slightly preheated, by the original current, this voltage peak results in an ignition of the lamp 4. However, should this not happen then the above-described process repeats itself since the tube 8 then cools again, the hydrogen pressure decreases again and the discharge is produced again between the electrodes 9 and 10 etc.

Upon ignition of the lamp 4 the voltage between its electrodes 5 and 6 decreases to the operating voltage of the lamp. This operating voltage is lower than the starting voltage of the switch 8 so that the shunt circuit 7 and 8 is then inoperative.

In a practical embodiment the impedance of the inductor 3 is approximately one Henry. The lamp 4 is a low-pressure mercury vapour discharge lamp of approximately 40 Watt, with an operating voltage of approximately 100 Volts. The capacitor 7 has a capacitance value of approximately one microFarad. The starting voltage of the switch 8 is approximately 250 Volt peak at room temperature (approximately 25° C.). The hydrogen pressure in the discharge tube 8 varies between a value which is below $10^{-5}$ Torr and about 10 Torr. At the highest hydrogen pressure the required operating voltage—this is in this case the required reignition voltage of the tube 8, namely the required voltage between the electrodes 9 and 10—rises to above 800 Volts. As this large voltage is not available, the discharge in the tube 8 extinguishes.

Before the final extinction of the discharge in the tube 8 is produced some local extinctions of discharge paths in that tube may also occur. Those local extinctions are short lasting extinctions of discharges which act on a small portion of the electrode surface. The extra voltage peaks produced in this manner between the main electrodes 5 and 6 of the lamp promote the lamp ignition process still further.

Figure 2:
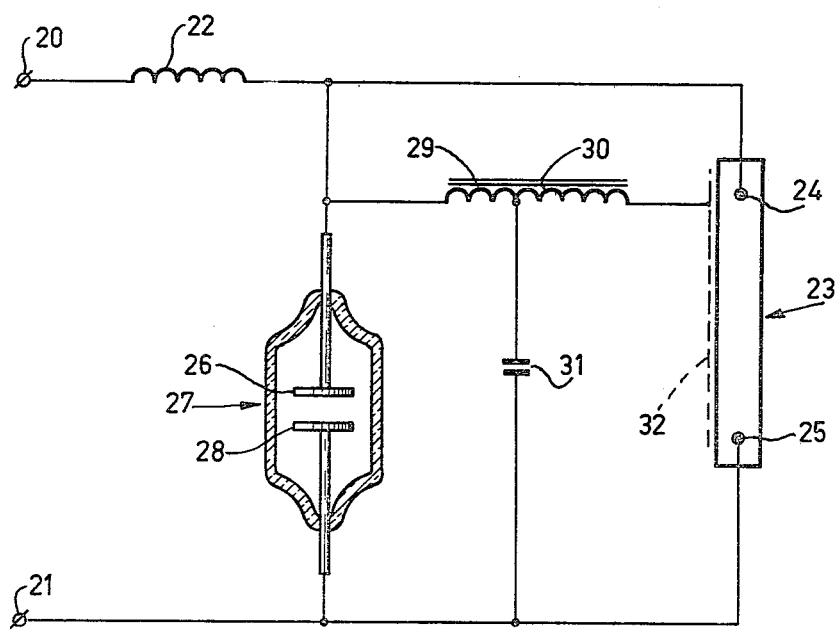
FIG. 2 shows a second electric device according to the invention in which a high-pressure sodium vapour discharge lamp is included in the circuit.

In FIG. 2 references 20 and 21 are again two input terminals which are intended for connection to an a.c. voltage supply mains of approximately 220 Volts, 50 Hertz. Reference 22 indicates a stabilisation inductance. Reference 23 is a schematic representation of a high-pressure sodium vapour discharge lamp. An electrode 24 of this lamp is connected to the stabilisation ballast 22. Another electrode 25 of the lamp is connected to the input terminal 21. A junction between the inductance 22 and the electrode 24 is connected to an electrode 26 of a switch 27 which is designed as a discharge tube. Another electrode 28 of the switch 27 is connected to the input terminal 21. Electrodes 26 and 28 are of the thermally—reversible getter type described with reference to electrodes 9 and 10 of FIG. 1. The electrode 26 is furthermore connected to a primary winding 29 of a transformer, the other winding of which is indicated by 30. A tapping point between the primary and the secondary winding of the transformer is connected to a capacitor 31. The other side of this capacitor is connected to the input terminal 21. The end of the secondary winding 30 is connected to an external starting electrode 32 of the lamp 23. Switch 27 may be part of the lamp 23.

The device of FIG. 2 operates as follows: If the terminals 20 and 21 are connected to the mains supply a current will start flowing from 20 via 22, 29, 31 back to the terminal 21. This will slightly charge the capacitor 31. If the voltage across the electrodes 26 and 28 reaches the ignition voltage of the switch 27 a discharge starts in this switch between these electrodes. Then the capacitor 31 discharges through the primary winding 29 and the switch 27. This produces a pulse in the secondary winding of the transformer which is passed on to the control electrode 32. Shortly thereafter hydrogen will be released from electrodes 26, 28 owing to the generation of heat in the switch 27 so that this switch becomes non-conducting again. This again produces a pulse in the transformer which is passed on to the control or starter electrode 32 etc. The switch 27 becomes conductive again, etc. This results in a plurality of pulses at the starter electrode 32 of the lamp 23 which results in an ignition of that lamp.

As in the circuit of FIG. 1 the switch 27 does not become conductive anymore in the operating condition of the lamp 23. This is caused by the fact that the ignition voltage of the switch 27 is chosen so that it exceeds the operating voltage of the lamp.

Figure 3:
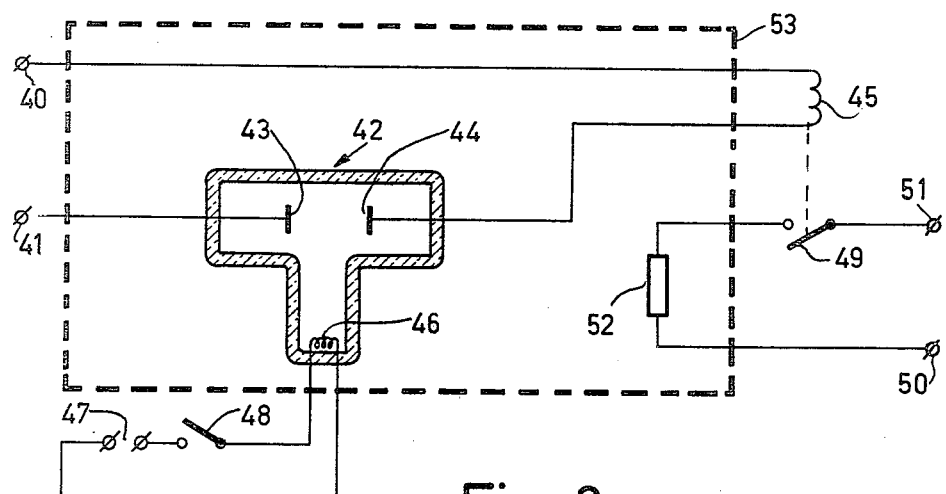
FIG. 3 shows a third electric device according to the invention which is constructed as a thermostat for an oven.

In FIG. 3 references 40 and 41 are terminals which are intended for connection to an a.c. voltage mains supply of approximately 200 Volts, 50 Hertz. Terminal 41 is connected to a diagrammatically shown discharge tube-switch 42 which is provided with a reversible hydrogen getter consisting of zirconium hydride. The terminal 41 is connected to a main electrode 43 of the switch 42. Another main electrode 44 of the switch 42 is connected to the other input terminal 40 through a winding of an electromagnetic relay 45. The switch 42 is provided with an appendix in which a heating element 46 is disposed which comprises the reversible getter. The heating element 46 is connected to a separate circuit consisting of a separate voltage source 47 in series with a switch 48.

The switching contact of the relay 45 is indicated by reference numeral 49. References 50 and 51 indicate a second pair of input terminals which are intended for connection to a supply source, for example the mains supply of approximately 220 Volts. Terminal 50 is connected to an additional heating element 52 of an electric oven 53 which contains switch 42. The other side of the heating element 52 is connected to the switching contact 49, whilst the other side of the contact 49 is connected to the input terminal 51.

The circuit of FIG. 3 operates as follows: If the terminals 40 and 41 are connected to the relevant supply source and the same applies to the terminals 50 and 51, no current will flow in the switch 42—which is in intimate heat contact with the oven—when the oven is sufficiently hot. This is caused by the fact that the temperature of the entire switch 42, and consequently also of the reversible hydrogen getter, is so high that the resultant high hydrogen pressure in that switch does not permit a discharge between the main electrodes 43 and 44. If, however, the temperature in the oven becomes too low, and consequently also the temperature of the switch 42, then a discharge will be produced between the electrodes 43 and 44 due to the reduced hydrogen pressure. This discharge results in a current through the relay coil 45 which closes the contact 49 which was originally open. This causes the additional heating element 52 of the oven to be connected to the supply source through the terminals 50 and 51, so that that oven is additionally heated. This causes the temperature in the oven to increase and consequently also the temperature of the switch 42 the getter of which releases more hydrogen again in that switch. As a result the discharge between the main electrodes 43 and 44 is extinguished. Another result is that also the current through the coil 45 is interrupted and the relay is deenergized. This causes the additional heating of the oven to be switched off. In emergency situations the switching element 48 may be closed—resulting in an extinguishing of the switch 42. Namely closing of the switch 42 results in hydrogen being released at 46, which release is now less dependent on the temperature in the oven. The arrangement 46, 47, 48 should therefore be considered as a kind of protection of the oven thermostatic equipment. This protection should, for example, be used if there is a risk of loosing control of the temperature in the oven.

Figure 4:
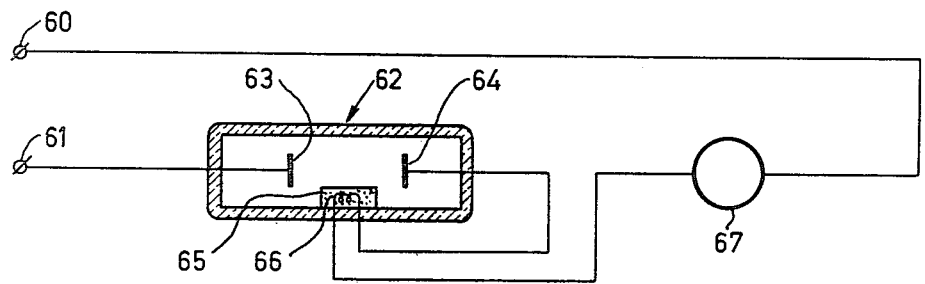
FIG. 4 shows a fourth electric device according to the invention which is constructed as a blinker unit.

In FIG. 4 references 60 and 62 are input terminals which are intended for connection to a d.c. voltage mains supply of approximately 220 Volts, 50 Hertz. The terminal 61 is connected to a switch 62 which is provided with a reversible hydrogen getter 65 for example titanium hydride. This switch comprises two main electrodes 63 and 64. The main electrode 63 is connected to the input terminal 61. The reversible hydrogen getter 65 is provided with a separate heating element 66. The switch 62, which is designed as a discharge tube, also contains argon to which mercury has been added. The main electrode 64 is connected to one end of the heating element 66, the other end of which is connected to an electric incandescent lamp 67. In its turn the other side of this incandescent lamp 67 is connected to the input terminal 60.

The device of FIG. 4 operates as follows: If the terminals 60 and 61 are connected to the relevant supply source a discharge will first be produced between the main electrodes 63 and 64 of the switch 62, which causes a current to flow in the circuit 61, 63, 64, 66, 67 to the terminal 60, namely alternatingly in the one or the other direction; depending on the instantaneous polarity of the power supply mains. This current lights lamp 62 and, via heating element 66, heats the getter 65 so that hydrogen is produced in the switch 62 which after some time extinguishes the discharge between the electrode 63 and 64, whereupon lamp 67 is extinguished. Thereafter the switch 62 cools down again, the hydrogen is taken up again by the getter 65 and a discharge between the main electrodes 64 and 64 starts again, so that the process repeats itself. Here the incandescent lamp operates as a flashing light, which may, for example, serve as a warning indicator. The incandescent lamp might, for example, be replaced by an acoustic warning device.

Figure 5:
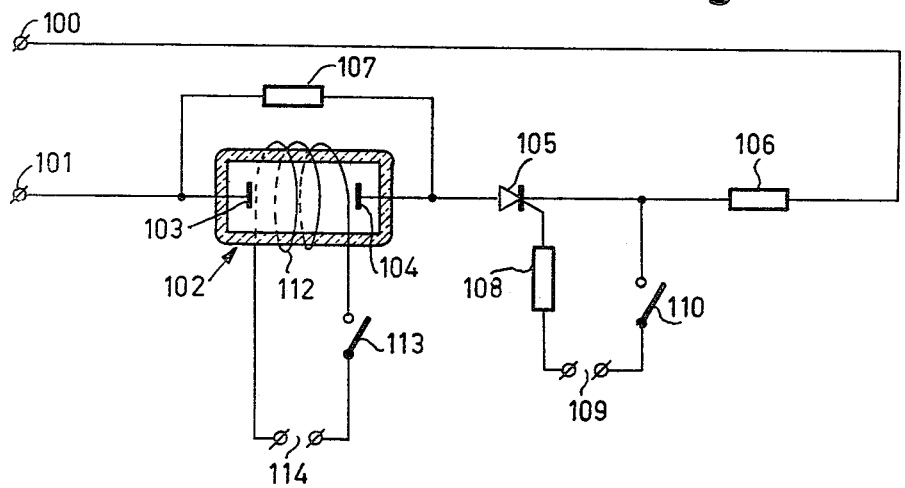
FIG. 5 shows a fifth electric device according to the invention in which a thyristor has been connected in series with the discharge tube-switch.

In FIG. 5 references 100 and 101 are terminals intended for connection to a d.c. voltage of approximately 1000 Volts. Reference 102 is a switch provided with a discharge tube. This switch comprises two main electrodes 103 and 104 respectively. These electrodes are of the thermally-reversible hydrogen getter type described with reference to the electrodes of FIG. 1. Electrode 103 is connected to the input terminal 101. The electrode 104 is connected to a thyristor 105. In its turn this thyristor 105 is connected to a load 106. The other side of the load 106 is connected to the terminal 100. Furthermore the switch 102 is shunted by a high-ohmic resistor 107. The control electrode of the thyristor 103 is connected to the cathode thereof through an auxiliary circuit consisting of a resistor 108, a d.c. voltage source 109 and a switch 110. To make the load 106 operative the terminals 100 and 101 are connected to the d.c. voltage source and the switch 110 is switched on momentarily. This produces a triggering signal at the control electrode of the thyristor 105 which causes a current to start flowing through 101, 107, 105, 106. This conducting stage of the thyristor also produces a discharge between the electrodes 103 and 104. Then a current through 101, 103, 104, 105, 106 flows to the terminal 100. If one wants to interrupt the current through the load 106 the temperature in that switching element 102 is increased by means of an enveloping heating coil 112. This is done by closing an auxiliary switch 113, in series with a low-voltage auxiliary supply source 114 and the heating coil. This warming-up produces such a high hydrogen pressure that the discharge through the switching element 102 is extinguished and the current through the thyristor 105 is now only a small current which flows through the high-ohmic resistor 107. However, the current through thyristor 105 is now below its hold current value so that this current ceases to flow.

Figure 6:
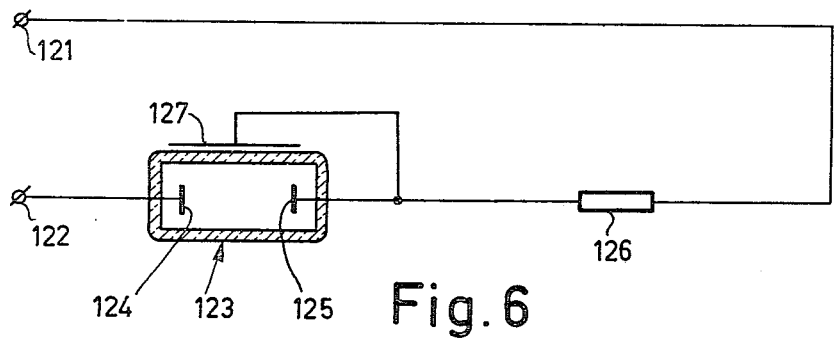
FIG. 6 shows a sixth electric device according to the invention in which the discharge tube-switch also comprises a starter electrode.

In FIG. 6 references 121 and 122 are input terminals intended for connection to an a.c. voltage supply mains of approximately 220 Volts, 50 Hertz. Reference 123 is a switch which is provided with a reversible hydrogen getter. This switch furthermore comprises two main electrodes 124 and 125. The main electrode 124 is connected to input terminal 122. The main electrode 125 is connected to the other input terminal 121 through a load 126. Reference 127 is a control electrode of the switch 123, this control electrode being connected to the main electrode 125.

When a voltage is applied between the terminals 121 and 122 the discharge tube 123 immediately becomes conductive, namely by the starting function of the auxiliary electrode 127. The current through the circuit may, for example, be extinguished by immersing the switch 123 in a warm liquid in a non-conducting container, not shown, or by means of a heating device, also not shown, for heating the reversible hydrogen getter (see, for example, 112-114 in FIG. 5).

Figure 7:
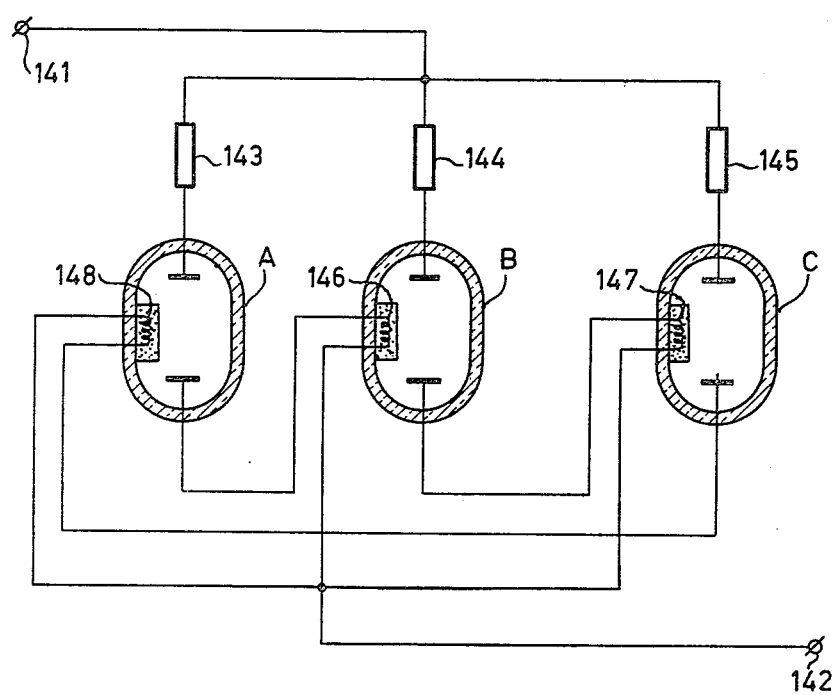
FIG. 7 shows a seventh electric device according to the invention having three discharge tube-switches.

In FIG. 7 references 141 and 142 are terminals intended for connection to a d.c. voltage. Three resistors 143, 144, 145 are connected to terminal 141. Each of those resistors is in series with a respective discharge tube switch according to the invention: A, B and C. Furthermore a main electrode of switch A is connected to a heating element 146 of the switch B, a main electrode of switch B is connected to a heating element 147 of switch C, a main electrode of switch C is connected to a heating element 148 of the switch A. The other ends of said heating elements 146, 147 and 148 are connected to the terminal 142.

If a d.c. voltage is present between the terminals 140 and 141 which exceeds the starting voltage of the mutually equal switches A, B and C it is achieved that these switches become alternatingly conductive in the following manner. Conducting switch A will extinguish the discharge in switch B when a reversible hydrogen getter, for example, titanium hydride, which is situated at 146 in switch B is heated. This results in that an originally warm getter at 47 cools down and switch C becomes conductive. This causes switch A to become non-conducting owing to the series arrangement of the main electrode path of switch C with element 148. This allows switch b to ignite again, which causes switch C to become non-conductive etc. The resistors 143, 144 and 145 may, for example, be incandescent lamps which then light-up sequentially.

From the above it will be clear that the discharge tube switch according to the invention functions without moving parts and can be used in many different ways.

What is claimed is:

1. An electric device provided with a switch which comprises a gas discharge tube which comprises at least two internal main electrodes, a reversible hydrogen getter disposed in said discharge tube, said getter releasing hydrogen when the temperature of the getter is increased and taking up hydrogen when the temperature is decreased, the magnitude of hydrogen pressure in said discharge tube at least partly determining the electrical conductivity of said switch, said discharge tube also containing a rare gas so that a change-over from the conducting state into the non-conducting state of the switch is accomplished by changing the getter temperature.

2. Apparatus as described in claim 1 wherein said hydrogen getter is in intimate thermal contact with the discharge path between said main electrodes.

3. Apparatus as described in claim 1 wherein said hydrogen getter is disposed on at least one of said main electrodes.

4. Apparatus as described in claim 3 further including a separate electric heating element for said getter.

5. Apparatus as described in claim 4 wherein the discharge path between said main electrodes is connected in series with said electric heating element.

6. Apparatus as described in claim 1 further including an electric load which is electrically connected to said switch.

7. Apparatus as described in claim 6 wherein said load is an electric lamp.

8. Apparatus as described in claim 7 for cooperation with an associated a.c. voltage supply wherein said lamp is a discharge lamp, said switch and said lamp are parallel branches and said switch and said lamp are parallel branches and said switch is further shunted by a circuit which comprises an electric coil and a capacitor, and the coil constitutes a primary winding of a transformer, a secondary winding of which is connected to a starter electrode of said lamp, said lamp being intended for connection to a power supply through a stabilization ballast.

9. Apparatus as described in claim 2 further including a load connected in series with said switch so that said load is operated intermittently.

10. Apparatus as described in claim 7 wherein said electric light is a flashing light.

11. Apparatus as described in claim 6 wherein said load is an apparatus for changing the temperature in an enclosed space, said switch being responsive to the temperature of said enclosed space and is part of a thermostatic device.

12. Apparatus as described in claim 1 further including a semiconductor switching element and said switch is connected in series with said semiconductor switching element which has the property that said element does not become non-conducting before the current strength through it falls to below a hold current value of said element.

13. A switch which comprises: a gas discharge tube which includes at least two internal main electrodes, a reversible hydrogen getter disposed in said discharge tube, a getter from which hydrogen is released when the temperature of said getter is increased and hydrogen is taken up when the temperature of said getter is decreased, and the amount of the hydrogen pressure in the discharge tube being co-determining for the electrical conductivity of said switch, at least one rare gas also being present in said discharge tube, and said getter having the characteristic that within a temperature range of 200° C. the hydrogen pressure in the discharge tube changes by at least a factor of 10, the hydrogen pressure at the lower limit of this range being at least $10^{-3}$ Torr.

14. A switch as claimed in claim 13 wherein said at least one rare gas in the discharge tube consists of neon to which not more than ten percent of argon has been added.

15. A switch as claimed in claim 13 wherein said rare gas is argon and said switch further includes mercury in said discharge tube.

16. A switch as claimed in claim 13 wherein said discharge tube further includes a starting electrode.

* * * * *